US005688753A

United States Patent [19]
Cala et al.

[11] Patent Number: 5,688,753
[45] Date of Patent: Nov. 18, 1997

[54] FLUX REMOVING COMPOSITION

[75] Inventors: Francis R. Cala, Highland Park; Richard A. Reynolds, Plainsboro, both of N.J.

[73] Assignee: Church & Dwight Co., Inc., Princeton, N.J.

[21] Appl. No.: 668,148

[22] Filed: Jun. 21, 1996

Related U.S. Application Data

[63] Continuation of Ser. No. 417,883, Apr. 6, 1995, abandoned.

[51] Int. Cl.$^6$ .............................. C11D 1/72; C11D 1/83; C11D 3/08; C11D 3/28
[52] U.S. Cl. ................ 510/175; 510/177; 510/423; 510/424; 510/426; 510/433; 510/500; 510/511; 134/2; 134/39
[58] Field of Search .................... 510/175, 177, 510/423, 424, 426, 433, 500, 511; 134/2, 39

[56] References Cited

U.S. PATENT DOCUMENTS

| 3,892,635 | 7/1975 | Mallico | 204/15 |
| 5,093,031 | 3/1992 | Logan et al. | 252/357 |
| 5,234,505 | 8/1993 | Winston et al. | 134/40 |
| 5,294,644 | 3/1994 | Login et al. | 514/698 |
| 5,397,495 | 3/1995 | Winston et al. | 252/109 |
| 5,431,847 | 7/1995 | Winston et al. | 252/174.24 |
| 5,433,885 | 7/1995 | Winston et al. | 252/174.24 |

*Primary Examiner*—Paul Lieberman
*Assistant Examiner*—Gregory R. Delcotto
*Attorney, Agent, or Firm*—Irving Fishman

[57] ABSTRACT

An aqueous flux removing composition is provided comprising alkali metal carbonate salts, an alkali metal silicate corrosion inhibitor and a surfactant formulation which comprises an N-alkylpyrrolidone. The N-alkylpyrrolidone is added in amounts sufficient to permit significantly faster cleaning speeds.

24 Claims, No Drawings

FLUX REMOVING COMPOSITION

This application is a continuation of application Ser. No. 417,883, filed Apr. 6, 1995, abandoned.

FIELD OF THE INVENTION

The present invention relates to novel aqueous cleaning compositions for removing flux residues from electronic circuit assemblies, such as printed circuit or printed wiring boards, during their fabrication. Alkali metal carbonate and bicarbonate salts are utilized with a specific surfactant formulation and specified anti-corrosion and brightening agent, to achieve a variety of objectives, among which are the removal of solder flux and other residues at faster cleaning rates.

BACKGROUND OF THE INVENTION

The cleanliness of electronic circuit assemblies (EAC), such as printed circuit boards (PCB) or printed wiring boards (PWB), is generally regarded as being critical to their functional reliability. Ionic and nonionic contamination on circuit assemblies is believed to contribute to premature failures of the circuit assemblies by allowing short circuits to develop.

In the manufacture of electronic circuit assemblies, ionic and nonionic contamination can accumulate after one or more steps of the process. Circuit assembly materials are plated, etched, handled by operators in assembly, coated with corrosive or potentially corrosive fluxes and finally soldered.

In the fabrication of electronic circuit assemblies, e.g., printed circuit boards, soldering fluxes are first applied to the substrate board material to ensure firm, uniform soldering of the components to the board. These soldering fluxes fall into three broad categories: rosin, water soluble, or no clean fluxes. The rosin fluxes, which are generally only moderately corrosive and have a much longer history of use, are still widely used throughout the electronics industry. The water soluble fluxes, which are a more recent development, are being used increasingly in consumer products applications. Because water soluble fluxes contain strong acids and/or amine hydrohalides, such fluxes are very corrosive. Unfortunately, residues of any flux can cause circuit failure if residual traces of the material are not carefully removed following soldering and thus remain on an electronic circuit assembly.

While water soluble fluxes can generally be removed with warm, soapy water, the removal of rosin flux from printed circuit boards is more difficult and has therefore traditionally been carried out with the use of chlorinated hydrocarbon solvents such as 1,1,1,-trichlorethane, trichloroethylene, trichloromonofluoromethane, methylene chloride, trichlorotrifluoroethane (CFC113), tetrachlorodifluoroethane (CFC112) or mixtures or azeotropes of these and/or other solvents. These solvents are undesirable, however, because they are toxic and harmful to the environment. Thus, use of such solvents is subject to close scrutiny by the Occupational Safety and Health Administration (OSHA) and the Environmental Protection Agency (EPA), as well as by international treaty which calls for the eventual elimination of such solvents.

Alkaline cleaning compounds known as the alkanolamines, usually in the form of monoethanolamine, have been used for rosin flux removal as an alternative to the toxic chlorinated hydrocarbon solvents. These high pH compounds (e.g., about 12 pH), chemically react with rosin flux to form a rosin soap through the process of saponification. Other organic substances such as surfactants or alcohol derivatives may be added to these alkaline cleaning compounds to facilitate the removal of such rosin soap. Unfortunately, these compounds have a tendency to cause corrosion on the surfaces and interfaces of printed wiring boards if such compounds and fluxes are not completely and rapidly removed during the fabrication process.

In other approaches, Daley et al., U.S. Pat. No. 4,635,666 utilize a highly caustic solution having a pH of 13 in a batch cleaning process. This method severely oxidizes the solder applied to the circuit board. In Hayes et al., U.S. Pat. Nos. 4,640,719 and 4,740,247 rosin soldering flux and other residues are removed from electronic assemblies by means of terpene compounds in combination with terpene emulsifying surfactants by rinsing in water.

Other residual contaminants besides flux residues are also likely to be found on electronic circuit assemblies and can be removed by the compositions and method of the present invention. Such other contaminants include, but are not limited to, for example, photoresist, solder masks, adhesives, machine oils, greases, silicones, lanolin, mold release, polyglycols and plasticizers.

The present assignee has developed an improved, patented cleaning composition characterized by non-corrosiveness and low environmental impact, unlike the prior art chlorinated hydrocarbon solvents and alkaline cleaners, and is employed for printed wiring board and printed circuit board cleaning. This rosin flux cleaner is marketed under the tradename Armakleen™. Armakleen™, as described in U.S. Pat. No. 5,431,478, comprises alkali metal carbonate and bicarbonate salts so combined to have a pH of from about 10 to less than 12. At least about 50 percent by weight of the carbonate salts comprise potassium carbonate. The cleaner further includes an alkali metal silicate which is added as a corrosion inhibitor and to brighten up solder joints on the circuit assemblies. The alkali metal silicate is stabilized in solution, in particular, in the aqueous concentrate in which the cleaner is marketed by means of a carboxylated polymer such as crosslinked polyacrylic acid. The cleaner further includes a surfactant formulation including an anionic surfactant and nonionic alkoxylated alcohol surfactants and an N-alkylpyrrolidone.

While the patented cleaning compositions as exemplified by Armakleen™ advantageously provide a safe and effective cleaner for removal of rosin soldering flux residues from electronic circuit assemblies such as printed circuit boards without otherwise adversely affecting the boards, and have found success in effectively replacing the chlorinated solvents, further improvement with respect to increasing cleaning speed would enhance the use of these aqueous cleaners in the commercial market. Further, the aqueous concentrates are hazy and somewhat viscous and, although the clarity and viscosity of the solution has no adverse affect on cleaning efficacy, users typically prefer a clear, thin product.

What is meant by the need for increasing cleaning speed, in fact, refers to an increased line speed for carrying the contaminated circuit assemblies through the washing equipment. Typically, large scale cleaning of the circuit assemblies such as the removal of rosin flux residues is achieved by loading the circuit boards on a conveyor assembly and passing the conveyor assembly through a washing station. Line speed, therefore, refers to the rate at which the conveyor carries the dirty circuit assemblies through the washing station of the machine for the removal of rosin flux and other residues.

Often, however, in assembling the printed circuit boards and the like, circuit boards of varying size are soldered at the same temperatures, i.e., the same reflow temperature profile, for the sake of expediency. Unfortunately, this one size fits all soldering temperature leads to the fact that the smaller boards are heated to a higher temperature compared to the larger boards which have a naturally higher heat capacity. What results is that the flux residues formed on the smaller boards are polymerized or are undesirably transformed into a nature which renders such flux residues substantially more difficult to remove. Accordingly, the line speeds through the washing equipment to remove the flux residues must be sufficiently slow to accommodate the harder to remove "baked on" flux residues from the smaller circuit assemblies.

The hazy clarity and moderate viscosity of the prior aqueous-based rosin flux cleaners which have been developed by the present assignee are believed to be the result of the addition of the crosslinked polyacrylate to the formula to maintain the alkali metal silicate corrosion inhibitor in solution, in particular, in the aqueous concentrate form. Without the polyacrylic acid stabilizer, it is very difficult to maintain the alkali metal silicate in solution particularly at a solution pH of less than 12.

It is an object of the present invention to provide improved compositions and methods for the safe and effective removal of rosin soldering flux residues from electronic circuit assemblies, e.g., printed circuit boards, without otherwise adversely affecting the boards.

It is a further objective of this invention to provide safe and effective compositions and methods which allow for the removal of rosin flux and other residual contaminants from printed circuit assemblies at faster line speeds through the washing equipment.

Still further, another objective of the invention is to provide a safe and effective aqueous-based cleaner for the removal of rosin flux and other residues from circuit assemblies, which cleaner can be provided as a clear and water thin concentrated formula.

These and other objects of the invention will become readily apparent upon consideration of the description of the invention as a whole including the appended claims.

SUMMARY OF THE INVENTION

This invention provides cleaning compositions and methods for the removal of rosin solder flux and other residues which remain during the fabrication of printed circuit or wiring boards. As a result, the possibility of premature circuit failure that might occur in the absence of such cleaning is eliminated or greatly reduced. The compositions of the invention are characterized by non-corrosiveness and anti-corrosive protection as well as low environmental impact, unlike the chlorinated hydrocarbon solvents and highly alkaline cleaners that have heretofore been employed for printed wiring board and printed circuit board cleaning.

The present invention provides printed circuit/wiring board aqueous cleaners comprising alkaline salts such as alkali metal carbonate salts or a mixture of alkali metal carbonate and bicarbonate salts, an alkali metal silicate to provide corrosion protection and metal brightening and a surfactant formulation which contains relatively small amounts of anionic and nonionic surfactants including an N-alkylpyrrolidone surfactant as exemplified in U.S. Ser. No. 136,390, filed Oct. 13, 1993, Example 32. It has been found that by increasing the amount of the N-alkylpyrrolidone surfactant over levels previously suggested, significantly higher line speeds for cleaning can be achieved.

It has also been discovered that the carboxylated stabilizer for the silicate corrosion inhibitor cannot be readily used due to an incompatibility with the present higher level of N-alkylpyrrolidone. The cleaner of the present invention containing a higher level of N-alkylpyrrolidone is silicate-stable without the presence of the crosslinked carboxylated polyacrylate stabilizer.

The aqueous cleaners of this invention are characterized by a pH of less than 12.0 and are clear solutions which when used in dilute aqueous solution are effective in removing all traces of rosin flux residues from circuit assemblies at greater line speeds than previous aqueous cleaners. Other adjuvants, e.g., anti-foam agents, hydrotropes, etc., can be included with the salts per se or in any solution thereof no matter what the concentration of salts therein.

DETAILED DESCRIPTION OF THE INVENTION

The objects and advantages mentioned above as well as other objects and advantages may be achieved by the compositions and methods hereinafter described.

Essentially, the flux removing compositions of this invention comprise certain alkali metal salts and alkali metal salt mixtures and a unique surfactant formulation which have yielded vast improvements in cleaning efficacy, formulation clarity and viscosity. Accordingly, the term "flux removing compositions" as used herein is intended to define the mixture of active ingredients comprised of the alkali metal salts including the added alkali silicate and the added surfactants as well as any added adjuvants as hereinlater described.

As hereinlater set forth, the flux removing compositions are preferably formulated into concentrated solutions. The terms "flux removing concentrated solutions" or "concentrates" as used herein define aqueous mixtures containing from about 1 to 45 or more percent by weight of the flux removing compositions with the balance being essentially water.

As used herein the terms "flux removing solutions" or "flux removing solutions in use" is meant to define aqueous mixtures containing from about 0.1 to 15 percent by weight of the flux removing composition with the balance comprised essentially of water and which are the solutions employed in the cleaning methods of the invention. Also, as used herein, "flux removing composition" and "cleaning composition" have the same meaning since as stated previously, the electronic circuit assemblies including printed circuit boards and printed wiring boards often contain residues other than fluxes which the compositions of this invention are able to remove and thus "flux removing composition" is intended as an all-purpose cleaner.

In accordance with the invention, additives, adjuvants, or the like, may be included with the flux removing compositions, flux removing concentrates, or the flux removing solutions in use.

The flux removing compositions of the present invention contain alkaline providing agents in the form of alkaline salts. Preferably, the alkaline salts include alkali metal carbonates or mixtures of alkali metal carbonates and bicarbonates. The alkali metals contemplated include potassium, sodium and lithium, with potassium being preferred. The carbonate salts include potassium carbonate, potassium carbonate dihydrate, and potassium carbonate trihydrate, sodium carbonate, sodium carbonate decahydrate, sodium carbonate heptahydrate, sodium carbonate monohydrate, sodium sesquicarbonate and the double salts and mixtures thereof. The bicarbonate salts include potassium bicarbonate, sodium bicarbonate, lithium bicarbonate and mixtures thereof.

Generally, the cleaning compositions, i.e., ingredients other than water, of the invention will contain the carbonate salts in amounts of from about 35 to 70 percent, preferably, about 45 to 60 percent, more preferably, from about 50 to 60 percent by weight. The carbonate salts preferably comprise at least about 50 percent by weight of potassium carbonate. The bicarbonate salts are present in amounts of about 0 to 20 percent, preferably, about 0 to 10 percent by weight, based on the composition. As set forth above, the alkali metal carbonate and bicarbonate salts are utilized in combinations and in concentrations such that the resultant solutions at the dilution of the wash bath and concentrate have a pH of from about greater than 10 to 12, preferably from about 10.7 to 12 and, more preferably, from about 11.0 to 11.7. It is most desirable that the salts used in combination at the dilution of the wash bath and at the desired pH also have an adequate reserve of titratable alkalinity, as least equivalent to from about 0.2 to 4.5 percent caustic potash (potassium hydroxide), when titrated to the colorless phenolphthalein end point, which is at about pH 8.0.

Although not preferred, other suitable alkaline salts can be used to replace all or part of the carbonate salts including the alkali metal ortho and complex phosphates. Examples of alkali metal orthophosphates include trisodium or tripotassium orthophosphate. The complex phosphates are especially effective because of their ability to chelate water hardness and heavy metal ions. The complex phosphates include, for example, sodium or potassium pyrophosphate, tripolyphosphate and hexametaphosphates. It is preferred, however, to limit the amount of phosphates contained in the cleaners of this invention to less than 1 wt. % (phosphorus) relative to the total alkaline salt used inasmuch as the phosphates are ecologically undesirable being a major cause of eutrophication of surface water. Additional suitable alkaline salts for use in the cleaning composition of this invention include the alkali metal borates, silicates, acetates, citrates, tartrates, secsonates, edates, etc. Such salts should be used in amounts that will provide the solution pH as described above.

The cleaning compositions of the present invention also include an alkali metal silicate which is added for the purpose of providing improved anti-corrosion protection to the printed circuit board as well as to ensure bright metallic surfaces including the solder joints as well as any connecting tabs and the like. Thus, any of the lithium, sodium or potassium silicates are useful in the cleaning compositions of this invention. Preferably, however, the sodium and potassium salts are utilized and, most preferably, potassium silicate is used. The alkali metal silicates which are used can be in a variety of forms which can be encompassed generally by the formula $M_2O:SiO_2$ wherein M represents the alkali metal and in which the ratio of the two oxides can vary. Most useful alkali metal silicates will have an $N_2O$ to $SiO_2$ mole ratio of between 1:0.5 and 1:4.5. Most preferably, the $M_2O$ to $SiO_2$ ratio is between 1:1.6 and 1:4.0. Such silicates also provide additional alkalinity to the wash water to help cleaning.

The alkali metal silicate will be present in the cleaning composition in amounts ranging from about 0.1 to 10 wt. %, based on the active components. The alkali metal silicate, most preferably, potassium silicate can be added to the dry salts and added to the wash bath or, preferably, is added with the salts in aqueous solution to form the aqueous concentrate.

The compositions of the present invention also include a surfactant formulation in order to enhance the wetting and emulsifying ability of the flux remover and permit maximum penetration thereof within regions of the circuit boards most difficult to clean. The surfactant formulation includes a mixture of anionic, nonionic, cationic surfactants or amphoteric surfactants. A combination of at least one of anionic, nonionic and cationic surfactant is preferred. The term "surfactant", as used herein, may include other forms of dispersing agents or aids.

Preferred nonionic surfactants are characterized as alkoxylated surfactants including compounds formed by condensing ethylene oxide with a hydrophobic base formed by the condensation of propylene oxide with propylene glycol. The hydrophobic portion of the molecule which exhibits water insolubility has a molecular weight of from about 1,500 to 1,800. The addition of polyoxyethylene radicals to this hydrophobic portion tends to increase the water solubility of the molecule as a whole and the liquid character of the product is retained up to the point where polyoxyethylene content is about 50 percent of the total weight of the condensation product. Examples of such compositions are the "Pluronics" sold by BASF.

Other suitable nonionic surfactants include those derived from the condensation of ethylene oxide with the product resulting from the reaction of propylene oxide and ethylenediamine or from the product of the reaction of a fatty acid with sugar, starch or cellulose. For example, compounds containing from about 40 percent to about 80 percent polyoxyethylene by weight and having a molecular weight of from about 5,000 to about 11,000 resulting from the reaction of ethylene oxide groups with a hydrophobic base constituted of the reaction product of ethylene diamine and excess propylene oxide, and hydrophobic bases having a molecular weight of the order of 2,500 to 3,000 are satisfactory.

In addition, the condensation product of aliphatic alcohols having from 8 to 18 carbon atoms, in either straight chain or branched chain configuration, with ethylene oxide and propylene oxide, e.g., a coconut alcohol-ethylene oxide-propylene oxide condensate having from 1 to 30 moles of ethylene oxide per mole of coconut alcohol, and 1 to 30 moles of propylene oxide per mole of coconut alcohol, the coconut alcohol fraction having from 10 to 14 carbon atoms, may also be employed.

Most useful are alkoxylated alcohols which are sold under the tradename of "Polytergent SL-series" surfactants by Olin Corporation or "Neodol" by Shell Chemical Co.

The polycarboxylated ethylene oxide condensates of fatty alcohols manufactured by Olin under the tradename of "Polytergent CS-1" are believed to be the most effective anionic surfactants. Polytergent CS-1 in combination with the above Polytergent SL-Series surfactants have been found particularly effective.

Effective surfactants which also provide antifoam properties include "Polytergent SLF-18" also manufactured by Olin and "Surfonic LF37" by Texaco which are nonionic alkoxylated alcohols.

The surfactant formulation also includes a cationic surfactant derived from N-alkyl pyrrolidone. Particularly preferred are N-(n-alkyl)-2-pyrrolidones wherein the alkyl group contains 6–15 carbon atoms. These compounds are described in U.S. Pat. No. 5,093,031, assigned to ISP Investments, Inc., Wilmington, Del. and which discloses surface active lactams and is herein incorporated by reference.

The above N-alkyl pyrrolidone products having a molecular weight of from about 180 to about 450 are conveniently prepared by several known processes including the reaction between a lactone having the formula

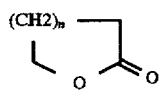

wherein n is an integer from 1 to 3, and an amine having the formula R'—NH$_2$ wherein R' is a linear alkyl group having 6 to 20 carbon atoms. The amine reactant having the formula R'—NH$_2$ includes alkylamines having from 6 to 20 carbon atoms; amines derived from natural products, such as coconut amines or tallow amines distilled cuts or hydrogenated derivatives of such fatty amines. Also, mixtures of amine reactants can be used in the process for preparing the pyrrolidone compounds. Such mixtures can include linear amino species having an alkyl of the same or different molecular weight. To form the pyrrolidone, the amine and lactone reactants, combined in a mole ration of from about 1:1 to about 1:5, are reacted under conditions of constant agitation, at a temperature between about 100° C. and about 350° C. under a pressure of from atmospheric to about 650 psig for a period of from about 1 to about 15 hours; preferably at 250° C. to 300° C. under an initial ambient pressure for a period of from 5 to 10 hours. The resulting pyrrolidone product is recovered and purified by distillation or by any other convenient recovery process.

The N-alkyl pyrrolidone products having 11 to 14 carbon atoms are clear, water white liquids, at room temperature; whereas those having 16 or more carbon atoms are solids. These pyrrolidones have a neutral or slightly basic pH, a surface tension between about 25 and about 35 dynes/cm as a 0.1% water solution and a viscosity of from about 6 to about 30 cps at 25° C.

Generally, the C$_6$ to C$_{14}$ alkyl pyrrolidones display primarily surfactant properties; whereas the C$_{16}$ to C$_{22}$ alkyl species are primarily complexing agents; although some degree of surfactant and complexing capability exists in all of the present species. One particular advantage of the alkyl pyrrolidone surfactants is the additional detergency that these surfactants provide to the compositions of this invention.

It is preferred to include at least one antifoam agent in any of the flux removing compositions of this invention. The antifoam agent is utilized to prevent the formation of excessive foam caused by the rosin flux/flux removing combination. The presence of foam interferes with the mechanical action of the cleaning equipment used to wash the circuit boards. It is important, if not critical, that the antifoam agent used herein does not act by replacing the flux film with another residual surface film which could affect the performance of the electronic circuit board in use. The antifoam agent could be an agent which solely acts to inhibit foam or it could be a surfactant which helps clean the boards and emulsify soils such as the nonionic Polytergent SLF-18 or Surfonic LF37 described above.

The amount of surfactant utilized, in general, including defoaming agent will be no more than about 20 wt. % of the composition but, can be varied depending on the conditions and contamination encountered. Preferably, the surfactant including defoamer comprises from 2 to 20 wt. % of the composition. More preferably, the N-alkylpyrrolidone surfactant comprises 4 to 10 wt. % of the composition, still more preferably, 6 to 8 wt. %. This level of N-alkylpyrrolidone is 3–5 times the level of this component added to the concentrate and wash bath as previously suggested. Also, it is preferable to include in the composition 1.5 to 4 wt. % of a defoaming agent or agents in the composition. It is to be understood that a portion of the surfactant level includes the defoamer level.

It may be necessary to include a hydrotrope to help solubilize any organic adjuvants such as surfactants, antifoam agents, etc. which are contained in the salt-containing concentrates.

The hydrotropes useful in this invention include the sodium, potassium, ammonium and alkanol ammonium salts of xylene, toluene, ethylbenzoate, isopropylbenzene, naphthalene, alkyl naphthalene sulfonates, phosphate esters of alkoxylated alkyl phenols, phosphate esters of alkoxylated alcohols and sodium, potassium and ammonium salts of the alkyl sarcosinates. The hydrotropes are useful in maintaining the organic materials including the surfactant readily dispersed in the aqueous cleaning solution and, in particular, in an aqueous concentrate which is an especially preferred form of packaging the compositions of the invention and allow the user of the compositions to accurately provide the desired amount of cleaning composition into the aqueous wash solution. A particularly preferred hydrotrope is one that does not foam. Among the most useful of such hydrotropes are those which comprise the alkali metal salts of intermediate chain length linear monocarboxylic fatty acids, i.e., C$_7$–C$_{13}$. Particularly preferred are the alkali metal octanoates and nonanoates. The hydrotropes are present in the composition in amounts of about 0–20 wt. %, preferably, 5 to 15 wt. %.

The cleaning compositions of the present invention which are comprised of alkaline salts, preferably, carbonate, bicarbonate and silicate salts and the surfactants as set forth above are preferably prepared as aqueous concentrates. Such aqueous cleaning concentrates may contain from about 5 up to about 45 percent by weight of the active components. Preferably, the concentrates contain about 10 to 30 percent, more preferably, about 15 to 20 percent by weight of the cleaning composition (i.e., carbonate, bicarbonate and silicate salts, surfactants, etc.) with the remainder essentially water.

Preferably, the alkaline cleaning salts used in the concentrate are alkali metal carbonates or hydrates thereof present in amounts of 6 to 20 wt. % of the concentrate, preferably, 7 to 12% and, more preferably, from about 7 to less than 10 wt. %. The alkali metal bicarbonate salts are present in the concentrate from 0 to 5 wt. %. The alkali metal silicate corrosion inhibitor is typically present in amounts of from about 1 to 5 wt. % of the concentrate. Preferably, absent from the concentrate of the present invention is an anionic polymer stabilizer which has been used previously to maintain the alkali metal silicate in solution. In accordance with the present invention, the surfactant formulation described above, in particular, the level of the N-alkylpyrrolidone surfactant used in the composition and concentrate of the present invention is sufficient to stabilize the alkali metal silicate. The concentrates of the present invention are clear solutions.

The preferred aqueous concentrates of this invention also contain the surfactant formulation described above, most preferably, a mixture of anionic and nonionic surfactants and, as well, the N-alkylpyrrolidone surfactant described above. The surfactants comprise from about 1 to 5 wt. % of the concentrate, preferably from about 1.5 to 3 wt. % of the concentrate. The surfactant amounts are meant to include all of the surfactants including the N-alkylpyrrolidone as well as any antifoam agent or agents used in the concentrate. Specifically, the amount of N-alkylpyrrolidone surfactant in the concentrate will range from about 0.4 to 3 wt. %, preferably, from about 0.6 to 2.0 and, more preferably, from about 1 to 1.5 wt. % of the concentrate. The amount of defoamer or antifoam agent in the concentrate will comprise from about 0.3 to 1.0 wt. %, preferably about 0.4 to 0.6 wt. % of the concentrate. To insure that the surfactants remain in aqueous solution, in particular, in the concentrate, the hydrotrope is preferably added in amounts of from about 0.5 to 4 wt. %, most preferably, from about 1 to 3 wt. % of the concentrate.

The flux removing solutions which are employed in the cleaning procedures described herein usually contain from about 0.5 to 10, or more, percent, preferably, from about 0.9 to 5 percent and, more preferably, from about 1 to 3 percent by weight of the cleaning compositions of this invention with the balance being essentially water. The upper limit of concentration of the cleaning composition is not critical and is determined by fabrication conditions, the amount of residues and the difficulty of removing same from the circuit assemblies, etc.

The compositions of this invention are characterized by low environmental impact, unlike the chlorinated hydrocarbon solvents and other materials that have been used prior to this invention for printed circuit board cleaning. For example, the alkali metal carbonate and bicarbonate salts are naturally occurring and environmentally benign. The flux removing compositions of the invention have biochemical oxygen demand (BOD) and chemical oxygen demand (COD) values which are much lower than alternative compositions currently available.

The applicability of the compositions of the invention to various aspects of the printed circuit/wiring board fabrication process can best be understood by a description of a representative assembly process.

The assembly manufacturing process involves the placement of components such as integrated circuits, resistors, capacitors, diodes, etc. on the surface of the board or their insertion through pre-drilled holes. The components are then secured by soldering by mechanical or automatic means. Interspersed with the soldering operations are cleaning procedures and inspections to ensure that tape and solder flux residues that could lead to premature circuit failure do not remain.

For the removal of rosin soldering flux deposits and other residues during printed circuit/wiring board fabrication, the compositions of the invention may be applied to the boards by immersion in dip tanks or by hand or mechanical brushing. Alternatively, they may be applied by any of the commercially available printed wiring board cleaning equipment. Dishwasher size units may be employed, or much larger cleaning systems such as the "Poly-Clean +" and the various "Hydro-Station" models produced by Hollis Automation, Inc. of Nashua, N.H.

Depending upon their design, these washers may apply the cleaning compositions of the invention by spraying with mechanical nozzles or by rolling contact with wetted roller surfaces. Generally, the boards are directed through the wash zone or zones on a continuous conveyor at a line speed effective to provide adequate cleaning. The cleaning composition of this invention has been developed for the purpose of effectively increasing the line speed through the wash cycles. The temperature at which the compositions may be applied can range from room, or ambient, temperature (about 70° F.) to about 180° F., preferably, about 145° to 165° F. The cleaning compositions or concentrates are diluted with water to as low as about 0.1 percent by weight (or volume) concentration.

Once solder flux has been loosened and removed during a period of contact which typically ranges from about 1 to about 5 minutes, but may be longer, up to 10 minutes, the boards are taken from the flux removing solution. Another advantage of the instant invention is that the flux removing solutions need not be flushed or rinsed with solvents as with the processes of the prior art. Herein, the boards may simply be flushed or rinsed with water for a period of up to about 10 minutes. Deionized water is preferred. The optimal rinsing time varies according to the kinds of surfactants and the concentrations of the flux removing solutions used and can easily be determined by routine experimentation.

The cleaned boards are then dried, preferably with forced air. Drying is expedited if the air is warmed, preferably to above about 100° F.

The cleaning solutions of this invention are also effective in removing other undesirable and deleterious substances and residues. For example, the cleaner of this invention is capable of removing one particularly troublesome substance, i.e., the residue formed from flux which has been overheated or "baked on" the boards and which comprises polymerized and/or oxidized flux. Additionally, the cleaner of this invention can remove solder balls which disadvantageously form during soldering subsequent to application of a water soluble flux. Other residues as previously described including adhesives, grease, oil, etc. are readily removed by the present cleaner.

The efficiency of removal of residues from printed circuit/wiring boards by the compositions of the invention is such that no residues are visible after cleaning. A simple 5–50× stereomicroscope can facilitate visual inspection for tape residues following cleaning.

EXAMPLE 1

A test was run to compare the cleaning performance of an aqueous flux removing solution (Armakleen™-2001) relative to a similar composition (Sample A) which represented the cleaner of this invention and which differed over the commercial cleaner by having approximately 5 times the level of an octylpyrrolidone surfactant in the aqueous concentrate and eventual wash bath. Other differences between the Armakleen E-2001 formulation and Sample A included a pH of 10.9 versus 11.3, Sample A had slightly over 4 times the amount of alkali metal silicate to improve brightening only and the amount of active ingredients relative to the aqueous wash solution was 2.1 wt. % for the Armakleen E2001 cleaner and 2.6 wt. % for Sample A. Levels of stabilizer, hydrotrope and surfactants other than the N-alkylpyrrolidone were the same in both the concentrate and the wash bath. Levels of alkali metal carbonate salt were also the same, the only difference being that the E-2001 formulation included a small amount of bicarbonate to account for the lower pH level.

The compositions were used to remove a rosin based flux, Qualitech 230–90, from boards being cleaned in a small in-line conveyorized spray washer from Technical Devices. Table 1 below illustrates the maximum line speed which was capable of effectively removing all of the rosin based flux from the boards.

TABLE 1

| CLEANER | TEMPERATURE | MAX. LINE SPEED |
|---|---|---|
| E-2001 | 157° | 1.5 ft./min |
| Sample A | 157° | 3.5 ft./min |
| Sample A | 152° | 3.5 ft./min |

As can be seen, the composition (Sample A) containing the greater level of the N-octylpyrrolidone surfactant substantially improved the maximum line speed for effective cleaning.

EXAMPLE 2

In this example, two compositions (Samples B and C) were compared for efficiency of cleaning residues of a water soluble flux and solder balls from circuit boards. A problem relative to soldering components on circuit boards when a water soluble flux has been used is the formation of solder balls which can infiltrate underneath the components. These solder balls are difficult to remove from these recesses in the boards.

The boards were cleaned on a Technical Device NU/clean P/S 518 conveyorized spray washer. Table 2 sets forth the formulations (concentrates) for samples B and C, in wt. % which were tested and compared.

TABLE 2

| Ingredient | B | C |
| --- | --- | --- |
| Water | 75.49 | 82.33 |
| Sodium Hydroxide | 0.68 | 0.28 |
| Potassium Carbonate | 7.81 | 5.15 |
| Sodium Carbonate Monohydrate | 6.90 | 4.55 |
| BF Goodrich Carbopol 625 | 0.90 | — |
| PQ Kasil #1 | 4.73 | 3.12 |
| Monatrope 1250 | 2.15 | 2.50 |
| Olin Polytergent CS-1 (Anionic) | 0.05 | 0.04 |
| Olin Polytergent S405LF | 0.15 | 0.1 |
| Olin Polytergent SL42 | 0.35 | 0.23 |
| Olin Polytergent SLF18 | 0.4 | 0.26 |
| Texaco Surfonic LF37 (defoam) | — | 0.20 |
| Octyl Pyrrolidone | 0.40 | 1.25 |
| pH | 11.30 | 11.40 |
| Clarity | Hazy | Clear |
| Dilution in Wash Bath | 10 wt. % | 15 wt. % |
| Viscosity (25° F.) | 600 CPS | 0–10 CPS |

Table 3 sets forth the results of washing and the maximum line speed through the washer to achieve the complete removal of solder balls.

TABLE 3

| Sample | B | C |
| --- | --- | --- |
| line speed | 1.5 ft/min | 2.5 ft/min |
| number of passes through wash | twice | once |

Sample C represents the preferred formulation of the present invention in which the amount of the N-alkylpyrrolidone surfactant is increased relative to the amount thereof in Sample B. Further, Sample C does not include the polyacrylic acid stabilizer (Carbopol) for the silicate and, is a more dilute solution. Because of these features Sample C is a stable, clear, less viscous solution. Salt concentration in the wash bath are essentially identical for both formulations. By increasing the level of the N-alkylpyrrolidone surfactant, it can be seen that the line speed through the washing equipment can be substantially increased and still achieve improved cleaning relative to Sample B which although an effective cleaner requires longer cleaning times.

EXAMPLE 3

In this example, Sample C above was tested to remove rosin paste (Qualitech 230–90) from boards using the same washer as used in Example 2. Table 4 sets forth the maximum line speed and prewash and wash temperatures and the visual evaluation of the boards.

TABLE 4

| LINE SPEED | PRE-WASH | WASH | VISUAL EVALUATION |
| --- | --- | --- | --- |
| 2.0 ft/min | 165° F. | 139° F. | clean/bright |
| 3.0 ft/min | 163° F. | 150° F. | clean/bright |
| 4.0 ft/min | 160° F. | 152° F. | bright/some residues but only one component |

What is claimed is:

1. A cleaning composition for the removal of flux residues from circuit assemblies comprising at least one alkali metal salt, an alkali metal silicate in addition to said one alkali metal salt, and a surfactant formulation comprising a mixture of an alkoxylated nonionic surfactant and an N-alkylpyrrolidone wherein said alkyl group contains 6 to 20 carbon atoms, said alkali metal silicate being characterized by the formula $M_2O:SiO_2$ wherein M represents an alkali metal and in which the ratio of $M_2O$ to $SiO_2$ is between 1:1.6 and 1:4.0, wherein said N-alkylpyrrolidone comprises 4 to 10 wt. % of said cleaning composition, further wherein said cleaning composition is devoid of an anionic polymer for the purpose of stabilizing said alkali metal silicate in aqueous solution.

2. The composition of claim 1 wherein said N-alkylpyrrolidone comprises N-octylpyrrolidone.

3. The composition of claim 1 wherein said at least one alkali metal salt comprises an alkali metal carbonate or a mixture of alkali metal carbonate and bicarbonate salts.

4. The composition of claim 3 comprising 35 to 70% by weight of alkali metal carbonate, 0 to 20% by weight alkali metal bicarbonate, 0.1 to 10 wt. % alkali metal silicate and 2 to 20% by weight of said surfactant formulation.

5. The composition of claim 1 wherein said surfactant formulation includes at least one defoaming agent.

6. The composition of claim 3 wherein said alkali metal carbonate is present in amounts of about 45 to 60 wt. % of said cleaning composition, said cleaning composition being devoid of alkali metal bicarbonates.

7. The composition of claim 5 further including a hydrotrope to maintain said surfactant formulation in aqueous solution.

8. The composition of claim 5 including 1.5 to 4 wt. % of a defoaming agent.

9. The composition of claim 5 wherein said surfactant formulation further comprises at least one anionic surfactant.

10. An aqueous cleaning concentrate capable of removing flux residues from circuit assemblies having a pH of greater than 10 to about 12 and comprising from about 70 to about 90 wt. % water and from about 5 to about 30 wt. % of a cleaning composition containing at least one alkali metal salt present in amounts sufficient to provide said concentrate with said pH of from greater than 10 to about 12, an alkali metal silicate corrosion inhibitor in addition to said one alkali metal salt and a surfactant formulation comprising a mixture of an alkoxylated nonionic surfactant and an N-alkylpyrrolidone, wherein said alkyl group contains 6 to 20 carbon atoms, said alkali metal silicate being characterized by the formula $M_2O:SiO_2$ wherein M represents an alkali metal and in which the ratio of $M_2O$ to $SiO_2$ is between 1:1.6 and 1:4.0, wherein said N-alkylpyrrolidone comprises 1 to 1.5 wt. % of said concentrate, said concentrate being devoid of an anionic polymer for stabilizing said alkali metal silicate in aqueous solution.

11. The aqueous concentrate of claim 10 wherein said N-alkylpyrrolidone is N-octylpyrrolidone.

12. The concentrate of claim 10 comprising 6 to 20 wt. % of alkali metal carbonate salts and 0 to 5 wt. % of alkali metal bicarbonate salts as said at least one alkali metal salt.

13. The aqueous concentrate of claim 12 comprising 7 to less than 10 wt. % alkali metal carbonate salts and 0% bicarbonate salt.

14. The aqueous concentrate of claim 13 wherein at least 50% of said alkali metal carbonate salt is potassium carbonate.

15. The aqueous concentrate of claim 12 containing 1 to 5 wt. % of said alkali metal silicate.

16. The concentrate of claim 12 comprising 1 to 5 wt. % of said surfactant formulation including said N-alkylpyrrolidone.

17. The aqueous concentrate of claim 10 wherein said surfactant formulation includes one or more defoaming agents, said one or more defoaming agents comprising from 0.3 to 1.0 wt. % of said concentrate.

18. The aqueous concentrate of claim 17 wherein said surfactant formulation further comprises an anionic surfactant.

19. The aqueous concentrate of claim 17 further including a hydrotrope to maintain said surfactant formulation in aqueous solution.

20. The aqueous concentrate of claim 19 wherein said hydrotrope comprises an alkali metal salt of a linear monocarboxylic acid having 7 to 13 carbon atoms.

21. The concentrate of claim 10 containing 10 to 30 wt. % of said cleaning composition with the balance water.

22. The concentrate of claim 21 containing 15 to 20 wt. % of said cleaning composition with the balance water.

23. The composition of claim 1, wherein said N-alkylpyrrolidone is present in said cleaning composition in an amount of from 6 to 8 wt. %.

24. A silicate-stable aqueous cleaning concentrate capable of removing flux residues from circuit assemblies and having a pH of from greater than 10 to about 12, comprising from about 70 to about 95 wt. % water and from about 5 to about 30 wt. % of a cleaning composition containing at least one alkali metal salt present in amounts sufficient to provide said concentrate with a pH of from greater than 10 to about 12, an alkali metal silicate characterized by the formula $M_2O:SiO_2$ wherein M represents an alkali metal and in which the ratio of $M_2O$ to $SiO_2$ is between 1:1.6 and 1:4.0, and a surfactant formulation including an N-alkylpyrrolidone, wherein said alkyl group contains 6 to 20 carbon atoms, said concentrate comprising from 0.6 to 3 wt. % of said N-alkylpyrrolidone, said concentrate being devoid of an anionic polymer for stabilizing said alkali metal silicate in aqueous solution.

* * * * *